US012795899B2

(12) United States Patent
Wang

(10) Patent No.: US 12,795,899 B2
(45) Date of Patent: Nov. 10, 2026

(54) CONTACT STRUCTURE, METHOD OF MANUFACTURING CONTACT STRUCTURE, AND SEMICONDUCTOR STRUCTURE

(71) Applicant: CHANGXIN MEMORY TECHNOLOGIES, INC., Hefei City (CN)

(72) Inventor: Haiyan Wang, Hefei City (CN)

(73) Assignee: Changxin Memory Technologies, Inc., Hefei (CN)

( * ) Notice: Subject to any disclaimer, the term of this patent is extended or adjusted under 35 U.S.C. 154(b) by 918 days.

(21) Appl. No.: 17/662,473

(22) Filed: May 9, 2022

(65) Prior Publication Data

US 2023/0262963 A1 Aug. 17, 2023

Related U.S. Application Data

(63) Continuation of application No. PCT/CN2022/081448, filed on Mar. 17, 2022.

(30) Foreign Application Priority Data

Feb. 17, 2022 (CN) ........................ 202210145921.1

(51) Int. Cl.
*H10B 12/00* (2023.01)

(52) U.S. Cl.
CPC ....... *H10B 12/485* (2023.02); *H10B 12/0335* (2023.02); *H10B 12/31* (2023.02)

(58) Field of Classification Search
CPC ...... H10B 12/03; H10B 12/01; H10B 12/033; H10B 12/053; H10B 12/056; H10B 12/09;

(Continued)

(56) References Cited

U.S. PATENT DOCUMENTS 6,165,864 A * 12/2000 Shen .................... H10B 12/033 257/E21.012
9,209,241 B2 12/2015 Kim et al.

(Continued)

FOREIGN PATENT DOCUMENTS

CN 102110642 A 6/2011
CN 103779318 A 5/2014

(Continued)

OTHER PUBLICATIONS

International Search Report cited in PCT/CN2022/081448 mailed Nov. 29, 2022, 9 pages.

*Primary Examiner* — Leonard Chang
*Assistant Examiner* — William Adrovel
(74) *Attorney, Agent, or Firm* — Intellectual Valley Law, P.C.

(57) ABSTRACT

The present disclosure relates to a contact structure, a method of manufacturing a contact structure, and a semiconductor structure. The method of manufacturing a contact structure includes: providing a substrate, where the substrate is provided with a shallow trench isolation structure; forming a medium layer covering the substrate and the shallow trench isolation structure; forming a contact hole in an active region of the substrate and in the medium layer, where the contact hole includes a first contact hole penetrating through the medium layer, and a second contact hole located at the bottom of the first contact hole and formed in the substrate; and forming a contact structure extending along a first direction in the contact hole and on the medium layer.

9 Claims, 5 Drawing Sheets

(58) Field of Classification Search
CPC .......................... H10B 12/0335; H10B 12/315; H10B 12/482; H10B 12/30; H10B 12/00; H01L 21/76224; H01L 21/76831; H01L 21/76802; H01L 21/76801; H01L 21/76832; H01L 21/76834
See application file for complete search history.

(56) References Cited

U.S. PATENT DOCUMENTS

| | | | | |
|---|---|---|---|---|
| 9,875,925 | B2 * | 1/2018 | Kong .................... | H01L 21/743 |
| 2005/0003307 | A1 | 1/2005 | Kuan et al. | |
| 2014/0061939 | A1 | 3/2014 | Yu et al. | |
| 2016/0329337 | A1 * | 11/2016 | Hwang .............. | H10B 12/0335 |
| 2018/0240705 | A1 * | 8/2018 | Chang ............... | H01L 21/76224 |
| 2020/0388620 | A1 * | 12/2020 | Park ..................... | H10B 12/315 |
| 2022/0052055 | A1 * | 2/2022 | Chun ..................... | H10B 12/34 |

FOREIGN PATENT DOCUMENTS

| | | | |
|---|---|---|---|
| CN | 107871742 | A | 4/2018 |
| CN | 112018080 | A | 12/2020 |
| CN | 113192892 | A | 7/2021 |

* cited by examiner

CONTACT STRUCTURE, METHOD OF MANUFACTURING CONTACT STRUCTURE, AND SEMICONDUCTOR STRUCTURE

CROSS-REFERENCE TO RELATED APPLICATIONS

This is a continuation of International Application No. PCT/CN2022/081448, filed on Mar. 17, 2022, which claims the priority to Chinese Patent Application 202210145921.1, filed with China National Intellectual Property Administration (CNIPA) on Feb. 17, 2022. The entire contents of International Application No. PCT/CN2022/081448 and Chinese Patent Application 202210145921.1 are incorporated herein by reference.

TECHNICAL FIELD

The present disclosure relates to the technical field of semiconductor integrated circuit manufacturing, and in particular, to a contact structure, a method of manufacturing a contact structure, and a semiconductor structure.

BACKGROUND

As a semiconductor memory commonly used in an electronic device such as a computer, a dynamic random access memory (DRAM) includes a plurality of memory cells. Each of the memory cells includes a memory capacitor, and a transistor electrically connected to the memory capacitor. The transistor includes a gate, a source region, and a drain region. The gate of the transistor is electrically connected to a word line. The source region of the transistor is used to form a bit line contact region to be electrically connected to a bit line by using a bit line contact structure. The drain region of the transistor is used to form a memory node contact region to be electrically connected to the memory capacitor by using a memory node contact structure.

However, as the DRAM is getting smaller, a size of a bit line contact (BLC) hole used to form the bit line contact structure is reduced accordingly. When the BLC hole is too small, there will be a void in the bit line contact structure in the BLC hole, which affects resistance and electrical properties of the bit line contact structure and a write recovery time (TWR) test of a DRAM device, resulting in poor performance of the DRAM device.

SUMMARY

Embodiments of the present disclosure provide a contact structure, a method of manufacturing a contact structure, and a semiconductor structure.

According to some embodiments, an aspect of the present disclosure provides a method of manufacturing a contact structure, including:

providing a substrate, wherein the substrate is provided with a shallow trench isolation (STI) structure, and the STI structure separates an active region in the substrate;

forming a medium layer covering the substrate and the STI structure; and forming a contact hole in the active region of the substrate and in the medium layer, wherein the contact hole includes a first contact hole penetrating through the medium layer, and a second contact hole located at the bottom of the first contact hole and formed in the substrate.

According to some embodiments, another aspect of the present disclosure provides a contact structure, which is manufactured by using the manufacturing method in some of the foregoing embodiments. The contact structure is formed in a contact hole. The contact hole is disposed in an active region of a substrate and in a medium layer. The medium layer covers the substrate. The contact hole includes a first contact hole penetrating through the medium layer, and a second contact hole located at the bottom of the first contact hole and formed in the substrate. The contact structure is also located on the medium layer and extends along a first direction.

According to some embodiments, still another aspect of the present disclosure provides a semiconductor structure, including the contact structure described in some of the foregoing embodiments, and a bit line structure or a memory capacitor that is disposed on a surface that is of the contact structure and away from the substrate.

Details of one or more embodiments of the present disclosure will be illustrated in the following drawings and description. Other features, objectives, and advantages of the present disclosure become evident in the specification, claims, and accompanying drawings.

BRIEF DESCRIPTION OF THE DRAWINGS

To describe the technical solutions in the embodiments of the present disclosure more clearly, the accompanying drawings required to describe the embodiments are briefly described below. Apparently, the accompanying drawings described below are only some embodiments of the present disclosure. A person of ordinary skill in the art may further obtain accompanying drawings of other embodiments based on these accompanying drawings without creative efforts.

FIG. 10 is also a schematic structural diagram of a contact structure according to an embodiment;

DETAILED DESCRIPTION

Figure 1:
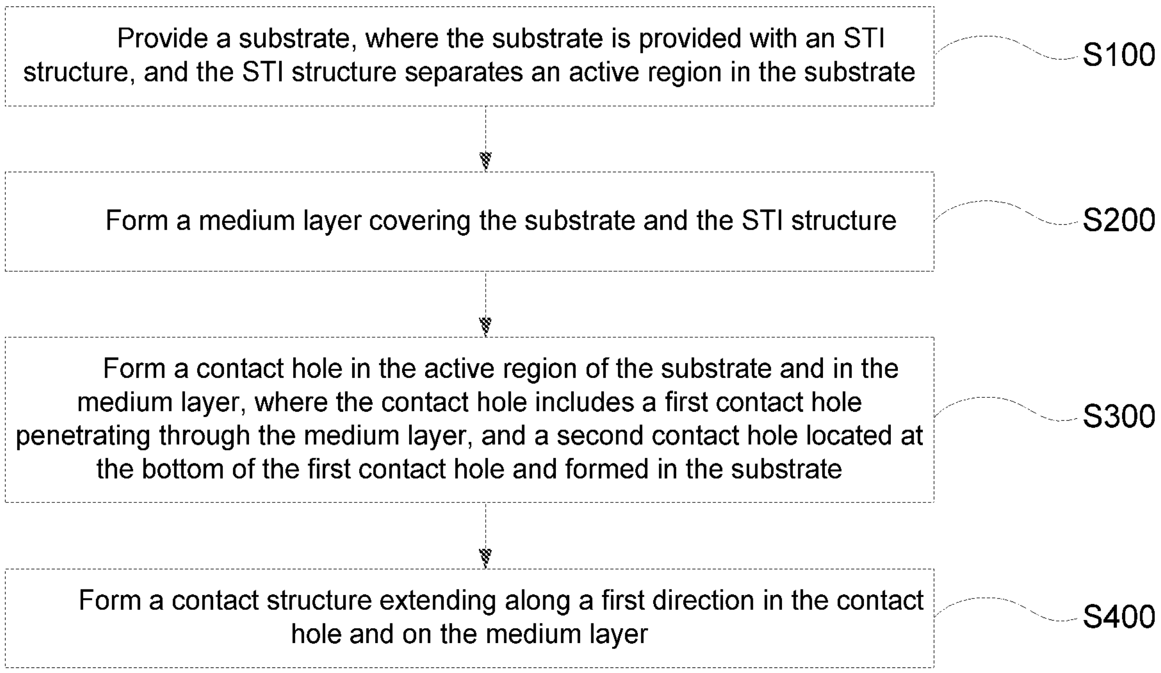
FIG. 1 is a schematic flowchart of a method of manufacturing a contact structure according to an embodiment.

To facilitate the understanding of the present disclosure, the present disclosure is described more completely below with reference to the related accompanying drawings. The preferred embodiments of the present disclosure are shown in the accompanying drawings. However, the present disclosure may be embodied in various forms without being limited to the embodiments described herein. On the contrary, these embodiments are provided to make the present disclosure more thorough and comprehensive.

Unless otherwise defined, all technical and scientific terms used herein have the same meaning as commonly understood by those skilled in the technical field of the present disclosure. The terms used in the specification of the present disclosure are merely for the purpose of describing specific embodiments, rather than to limit the present disclosure. The term "and/or" used herein includes any and all combinations of one or more of the associated listed items.

It should be understood that when an element or a layer is described as "being on", "being connected to" or "being coupled to" another element or layer, it can be on, connected to, or coupled to the another element or layer directly, or intervening elements or layers may be present. On the contrary, when an element is described as "being directly on", "being directly connected to" or "being directly coupled to" another element or layer, there are no intervening elements or layers. It should be understood that although terms such as first, second, and third may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teachings of the present disclosure, the first element, component, region, layer or section discussed below may be expressed as a second element, component, region, layer or section.

Spatial relationship terms such as "under", "beneath", "lower", "below", "above", and "upper" can be used herein to conveniently describe the relationship shown in the figure between one element or feature and another element or feature. It should be understood that in addition to the orientations shown in the figure, the spatial relationship terms are intended to further include different orientations of used and operated devices. For example, if a device in the accompanying drawings is turned over, a device or feature described as being "beneath another element", "below it", or "under it" is oriented "on" the another element or feature. Therefore, the exemplary terms "beneath" and "under" may include two orientations of above and below. The device may be otherwise oriented (rotated by 90 degrees or other orientations), and the spatial description used herein is interpreted accordingly.

The purpose of the terms used herein is only to describe specific embodiments instead of being a limitation of the present disclosure. In this specification, the singular forms of "a", "an" and "the/this" also include plural forms, unless clearly indicated otherwise. It should also be understood that terms "include" and/or "comprise", when used in this specification, determine the presence of features, integers, steps, operations, elements and/or components, but do not exclude the presence or addition of one or more other features, integers, steps, operations, elements, components and/or groups. In this specification, the term "and/or" includes any and all combinations of related listed items.

Embodiments of the present disclosure are described herein with reference to cross-sectional views as schematic diagrams of idealized embodiments (and intermediate structures) of the present disclosure, such that variations shown in the shapes and due to, for example, manufacturing techniques and/or tolerances can be contemplated. Therefore, the embodiments of the present disclosure should not be limited to the specific shapes of the regions shown herein, but include shape deviations due to, for example, manufacturing techniques. The regions shown in the figure are schematic in nature, and their shapes are not intended to show actual shapes of the regions of the device or limit the scope of the present disclosure.

Referring to FIG. 1, an embodiment of the present disclosure provides a method of manufacturing a contact structure, including:

S100: Provide a substrate. The substrate is provided with an STI structure, and the STI structure separates an active region in the substrate.

S200: Form a medium layer covering the substrate and the STI structure.

S300: Form a contact hole in the active region of the substrate and in the medium layer. The contact hole includes a first contact hole penetrating through the medium layer, and a second contact hole located at the bottom of the first contact hole and formed in the substrate.

S400: Form a contact structure extending along a first direction in the contact hole and on the medium layer.

In some embodiments, an aperture of a part that is of the second contact hole and close to the first contact hole gradually increases along a direction close to the first contact hole, and a maximum aperture of the second contact hole is equal to or less than an aperture of the first contact hole.

In this embodiment of the present disclosure, the contact hole is constituted by the first contact hole in the medium layer and the second contact hole in the substrate that communicate with each other, and a partial aperture of the second contact hole increases along the direction close to the first contact hole, and the maximum aperture of the second contact hole is equal to or less than the aperture of the first contact hole. In this way, when a bottom size of the contact hole is small, it can be ensured that the contact hole still has a large opening size, which is conducive to reducing a high aspect ratio of the contact hole and improving step coverage of a contact structure. This can avoid unnecessary is pores in the contact structure, which can further avoid abnormal electrical properties of a semiconductor structure due to metal penetration and filling of the pores in the contact structure. This embodiment of the present disclosure can improve electrical performance of the contact structure and the semiconductor structure in which the contact structure is located, so as to improve a yield of the semiconductor structure.

Figure 2:
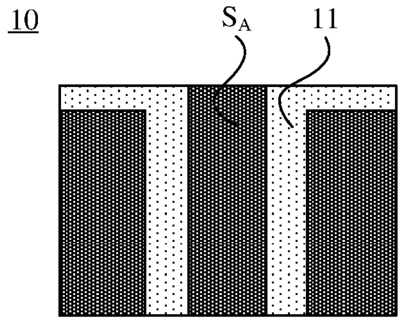
FIG. 2 is a schematic diagram of a structure obtained in step S100 according to an embodiment.

In step S100, referring to S100 in FIG. 1 and FIG. 2, a substrate 10 is provided. The substrate 10 is provided with an STI structure 11, and the STI structure 11 separates an active region $S_A$ in the substrate 10.

In some embodiments, the substrate 10 includes but is not limited to a silicon substrate or a silicon-based substrate.

In some embodiments, the STI structure 11 is a silicon oxide ($SiO_2$) isolation structure. The STI structure 11 can separate a plurality of active regions $S_A$ arranged in an array in the substrate 10. The active region $S_A$ includes a source region and a drain region. In FIG. 2 to FIG. 10, only the source region or drain region of one active region $S_A$ is taken as an example.

Figure 3:
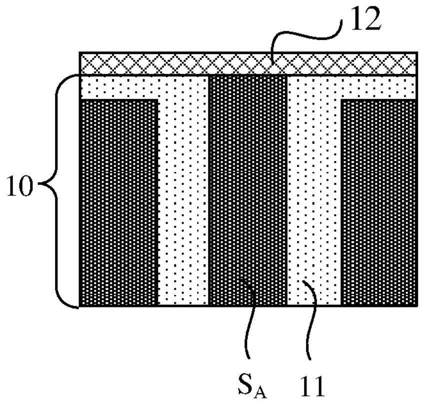
FIG. 3 is a schematic diagram of a structure obtained in step S200 according to an embodiment.

In step S200, referring to S200 in FIG. 1 and FIG. 3, a medium layer 12 covering the substrate 10 and the STI structure 11 is formed.

Herein, the medium layer 12 and the STI structure 11 are made of different materials, and the medium layer 12 can be used as a protective layer for etching the STI structure 11 subsequently.

In addition, a thickness of the medium layer 12 may be set according to an actual requirement. This is not limited in this embodiment of the present disclosure.

In some embodiments, the medium layer 12 is a silicon nitride layer.

Figure 4:
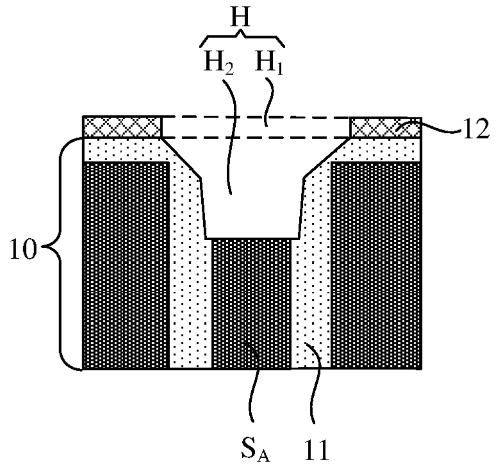
FIG. 4 is a schematic diagram of a structure obtained in step S300 according to an embodiment.

In step S300, referring to S300 in FIG. 1 and FIG. 4, a contact hole H is formed in the active region $S_A$ of the substrate 10 and in the medium layer 12.

For example, the contact hole H includes a first contact hole $H_1$ penetrating through the medium layer 12, and a second contact hole $H_2$ located at the bottom of the first contact hole $H_1$ and formed in the substrate 10.

In some embodiments, an aperture of a part that is of the second contact hole $H_2$ and close to the first contact hole $H_1$ gradually increases along a direction close to the first contact hole $H_1$, and a maximum aperture of the second contact hole $H_2$ is equal to is or less than an aperture of the first contact hole $H_1$.

For example, the aperture of the part that is of the second contact hole $H_2$ and close to the first contact hole $H_1$ increases uniformly (for example, increases linearly) or increases according to a preset change rule (for example, increases curvilinearly) along the direction close to the first contact hole $H_1$.

For example, referring to FIG. 4, if the part that is of the second contact hole $H_2$ and close to the first contact hole $H_1$ and whose aperture gradually increases along the direction close to the first contact hole $H_1$ is taken as a first part, the second contact hole $H_2$ further includes a second part located on a side on which the first part of the second contact hole $H_2$ is away from the first contact hole $H_1$. An aperture of the second part may remain unchanged or gradually increase along a direction close to the first part. Moreover, in an example in which the aperture of the second part of the second contact hole $H_2$ gradually increases along the direction close to the first part of the second contact hole $H_2$, a change rate when the aperture of the second part increases along the direction close to the first part is less than a change rate when the aperture of the first part increases along the direction close to the first contact hole $H_1$.

Depths of the first contact hole $H_1$ and the second contact hole $H_2$ may be set according to an actual requirement. Because the first contact hole $H_1$ penetrates through the medium layer 12, a deposition thickness of the medium layer 12 is the depth of the first contact hole $H_1$.

Orthographic projection of any cross section of the contact hole H on the substrate 10 may be circular, elliptical, rectangular, or rhombic. This is not limited in this embodiment of the present disclosure. Accordingly, an aperture of the contact hole H is a size of the contact hole H on a cross section that is of the contact hole H and parallel to the substrate 10.

In addition, that a maximum aperture of the second contact hole $H_2$ is equal to an aperture of the first contact hole $H_1$ means that an upper edge of the second contact hole $H_2$ coincides with a lower edge of the first contact hole $H_1$. That a maximum aperture of the second contact hole $H_2$ is less than an aperture of the first contact hole $H_1$ means that there is a gap between the upper edge of the second contact hole $H_2$ and the lower edge of the first contact hole $H_1$, and the upper edge of the second contact hole $H_2$ and the lower edge of the first contact hole $H_1$ can be connected by a plane parallel to the substrate 10.

In some embodiments, the aperture of the first contact hole $H_1$ may gradually increase or remain unchanged along a direction away from the second contact hole $H_2$.

Figure 5:
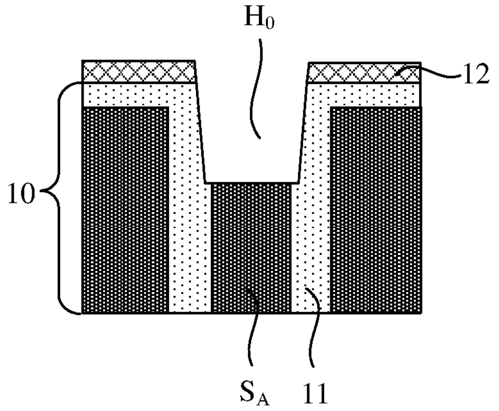
FIG. 5 is a schematic diagram of a structure obtained in step S310 according to an embodiment.

In some embodiments, step S300 includes:

S310: Referring to FIG. 5, form a contact bottom hole $H_0$ in the active region $S_A$ of the substrate 10 and in the medium layer 12.

Herein, the contact bottom hole $H_0$ is formed by using one patterning process. That is, the medium layer 12 and the active region $S_A$ of the substrate 10 are etched based on a same mask to form the contact bottom hole $H_0$.

Optionally, the contact bottom hole $H_0$ is disposed in one-to-one correspondence with the source region and/or the drain region of the active region $S_A$ of the substrate 10.

It can be understood that a bottom size of the contact bottom hole $H_0$ depends on a size of a contact hole that can be set in a semiconductor structure. After the contact bottom hole $H_0$ is formed through etching, based on the size of the contact bottom hole $H_0$, a sidewall of the contact bottom hole $H_0$ may be constituted by the substrate 10 or the STI structure 11.

In some embodiments, as shown in FIG. 5, the contact bottom hole $H_0$ exposes a part of the STI structure 11, and the sidewall of the contact bottom hole $H_0$ is constituted by the STI structure 11.

S320: Referring to FIG. 6 to FIG. 9, remove a part of the sidewall of the contact bottom hole $H_0$ to form the first contact hole $H_1$ in the medium layer 12 and the second contact hole $H_2$ in the substrate 10.

It can be understood that the medium layer 12, the STI structure 11, and the substrate 10 are made of different materials, and the first contact hole $H_1$ and the second contact hole $H_2$ can be formed by using different etching methods.

Figure 6:
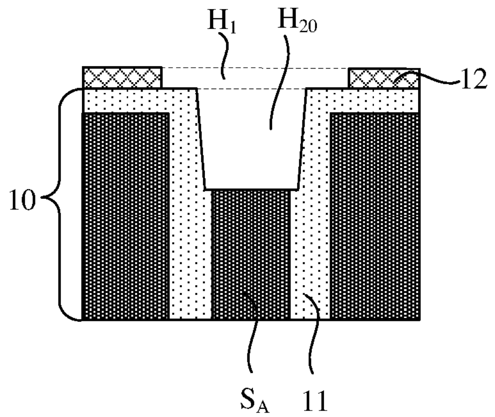
FIG. 6 to FIG. 9 are schematic diagrams of structures obtained in substeps of step S320 according to an embodiment.

In some embodiments 11, the sidewall of the contact bottom hole $H_0$ is constituted by the STI structure. Step S320 includes:

S321: Etch back and remove a part of the medium layer 12 based on the contact bottom hole $H_0$ to form the first contact hole $H_1$ and a guide hole $H_{20}$ at the bottom of the first contact hole $H_1$, as shown in FIG. 6.

Herein, the guide hole $H_{20}$, namely, a part that is of the contact bottom hole $H_0$ and located in the substrate 10, may specifically be a part lower than an initial exposed surface of the active region $S_A$ or lower than an initial upper surface of the STI structure 11.

For example, the medium layer 12 is the silicon nitride layer. Performing etchback on the silicon nitride layer can effectively remove some silicon nitride materials to increase a critical dimension (CD) of an opening of the silicon nitride layer, in other words, to increase an aperture of a part that is of the contact bottom hole $H_0$ and located in the medium layer 12, to obtain the first contact hole $H_1$.

For example, the medium layer 12 can be etched back and removed by cleaning a structure obtained after the contact bottom hole $H_0$ is formed.

In some embodiments, the medium layer 12 is etched back and removed through wet etching. For example, the structure obtained after the contact bottom hole $H_0$ is formed is cleaned by using hydrofluoric acid solution, phosphoric acid solution, and standard cleaning solution in turn, to etch back and remove the part of the medium layer 12, so as to form the first contact hole $H_1$.

S322: Remove a part of the STI structure 11 based on the first contact hole $H_1$ and the guide hole $H_{20}$ to form the second contact hole $H_2$.

After the first contact hole $H_1$ is formed, the part of the STI structure 11 is exposed at the bottom of the first contact hole $H_1$. On this basis, the second contact hole $H_2$ can be formed by removing, from top to bottom, a part of an upper sidewall that is of the contact bottom hole $H_0$ and located in the substrate 10, and a partial aperture of the second contact hole $H_2$ can be increased along the direction close to the first contact hole $H_1$.

In some embodiments, the sidewall of the contact bottom hole $H_0$ is constituted by the STI structure 11, and step S322 includes:

S3221: Form a hard mask 13 in the guide hole $H_{20}$, such that the to-be-removed part of the STI structure 11 is exposed above the hard mask 13.

For example, a method of manufacturing the hard mask 13 is described below.

Figure 7:
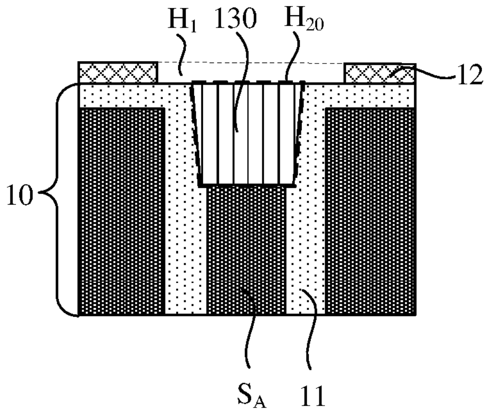

At first, referring to FIG. 7, a hard mask material 130 is filled in the guide hole $H_{20}$.

Herein, the hard mask material 130 may be set according to an actual requirement, for example, may be a photoresist material or a spin on hard mask (SOH) material.

In some embodiments, the hard mask material 130 is the SOH material. The hard mask material 130 may be coated in the first contact hole $H_1$ and the guide hole $H_{20}$ by using a spin coating process or in another manner. For example, the hard mask material 130 may be filled only in the part that is of the contact bottom hole $H_0$ and located in the substrate 10, namely, filled in the guide hole H20, by using a deposition process.

Herein, the deposition process includes but is not limited to physical vapor deposition (PVD), chemical vapor deposition (CVD), atomic layer deposition (ALD), or the like.

Figure 8:
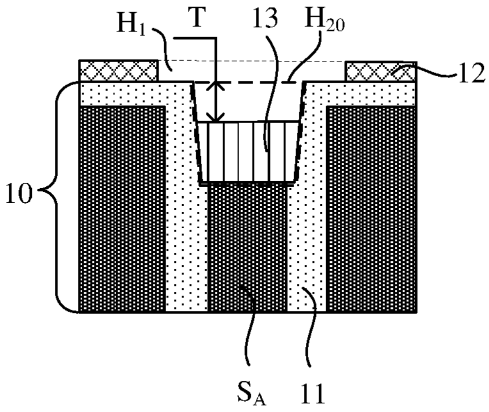

Then, the hard mask material 130 is removed by a preset thickness T, such that the hard mask material retained in the guide hole $H_{20}$ forms the hard mask 13, as shown in FIG. 8.

Herein, the preset thickness T can be determined based on a forming thickness of the hard mask material 130 and a height of a part that is of the second contact hole $H_2$ and whose aperture is changed, such that the part of the STI structure 11 is exposed above the hard mask 13.

Figure 9:
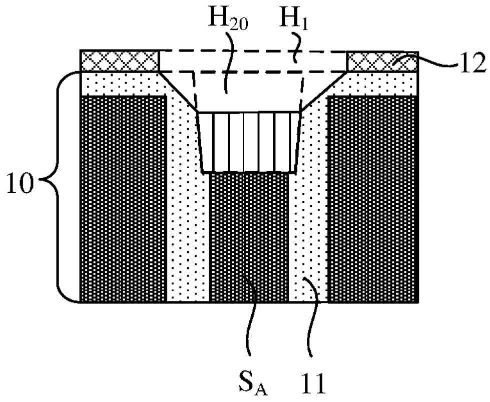

S3222: Remove the part of the STI structure 11 based on the first contact hole $H_1$ and the hard mask 13. In other words, a part of a sidewall that is of the guide hole $H_{20}$ and exposed above the hard mask 13 is removed, as shown in FIG. 9.

For example, the STI structure 11 can be removed through etching, for example, wet etching.

In some embodiments, the STI structure 11 is the $SiO_2$ isolation structure, and the hydrofluoric acid solution can be used to perform wet etching on a structure obtained the hard mask 13 is formed.

S3223: Remove the hard mask 13 to form the second contact hole $H_2$, where for example, a structure shown in FIG. 4 is obtained.

Herein, the hard mask 13 may be removed, for example, through plasma etching.

Figure 10:
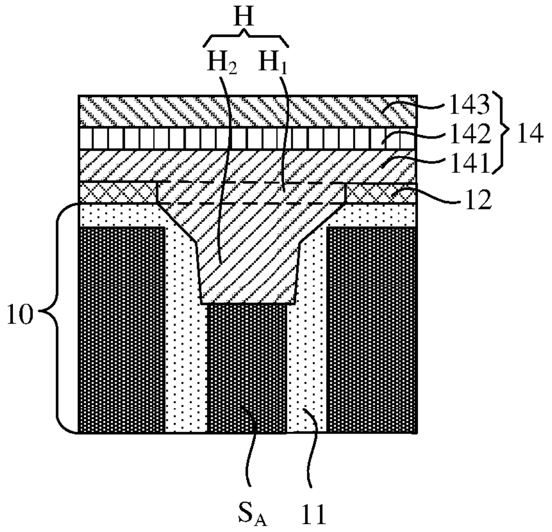
FIG. 10 is a schematic diagram of a structure obtained in step S400 according to an embodiment.

In step S400, referring to S400 in FIG. 1 and FIG. 10, a contact structure 14 extending along the first direction is formed in the contact hole H and on the medium layer 12.

It can be understood that a method of manufacturing the contact structure 14 varies with a structure of the contact structure 14. The contact structure 14 is, for example, a bit line contact structure, but is not limited thereto.

In some embodiments, with reference to FIG. 10, the method of manufacturing the contact structure 14 includes the following.

S410: Forming a contact conductive layer 141 extending along the first direction in the contact hole H and on the medium layer 12.

In some embodiments, the contact conductive layer 141 is a polycrystalline silicon layer, but is not limited thereto. Another conductive material with same or similar electrical performance as polycrystalline silicon can also be used to form the contact conductive layer 141.

In some embodiments, the contact conductive layer 141 is formed by using the deposition process, and a part of the contact conductive layer 141 is filled in the contact hole H.

Herein, the deposition process includes but is not limited to PVD, CVD, ALD, or the like.

In this embodiment of the present disclosure, the contact hole H is constituted by the first contact hole $H_1$ and the second contact hole $H_2$ that communicate with each other, the partial aperture of the second contact hole $H_2$ increases along the direction close to the first contact hole $H_1$, and the maximum aperture of the second contact hole $H_2$ is equal to or less than the aperture of the first contact hole $H_1$. In this way, an opening size of the contact hole H can be increased by using the first contact hole $H_1$, and a part that is of the first contact hole $H_1$ and whose aperture is changed can be connected by using the second contact hole $H_2$ to decrease a step slope. On this basis, after the contact conductive layer 141 is formed in the contact hole H, unnecessary pores can be avoided in the contact conductive layer 141, and it can be ensured that the contact conductive layer 141 has good step coverage.

S420: Form a first barrier layer 142 covering the contact conductive layer 141.

In some embodiments, a material of the first barrier layer 142 includes titanium. The first barrier layer 142 may be configured to block diffusion of nitrogen ions.

In some embodiments, the first barrier layer 142 is formed by using the deposition process, for example, through PVD, CVD, or ALD.

In some embodiments, a thickness of the first barrier layer 142 may range from 5 nm to 10 nm. For example, the thickness of the first barrier layer 142 may be 5 nm, 6 nm, 8 nm, or 10 nm.

S430: Form a second barrier layer 143 covering the first barrier layer 142.

Figure 11:
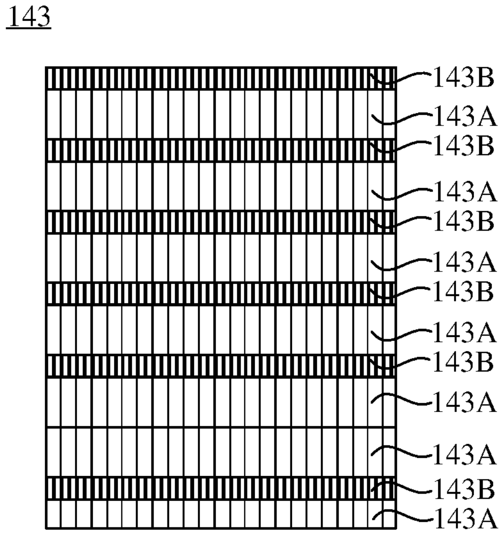
FIG. 11 is a schematic structural diagram of a second barrier layer according to an embodiment.

In some embodiments, as shown in FIG. 11, the second barrier layer 143 is a layer group (TSN) formed by laminating a titanium nitride layer 143A and a silicon nitride layer 143B alternately. A thickness of any titanium nitride layer 143A or silicon nitride layer 143B may be set according to an actual requirement. Moreover, a lamination sequence of the titanium nitride layer 143A and the silicon nitride layer 143B may also be adjusted according to an actual requirement.

In some examples in which the contact conductive layer 141 is the polycrystalline silicon layer, the second barrier layer 143 with the above structure can effectively prevent diffusion of impurity elements (such as boron (B) and phosphorus (P)) in the contact conductive layer 141 to a conductive structure connected to the contact structure 14, so as to avoid adverse impact of the impurity elements on electrical properties of the conductive structure. In an example in which the contact structure 14 is the bit line contact structure, the conductive structure connected to the contact structure 14 is a bit line in the bit line structure. In an example in which the contact structure 14 is a memory node contact structure, the conductive structure connected to the contact structure 14 is a memory capacitor.

Based on the foregoing description, the second barrier layer 143 is manufactured by depositing the titanium nitride layer 143A and the silicon nitride layer 143B on the first barrier layer 142 periodically.

Herein, the periodic deposition of the titanium nitride layer 143A and the silicon nitride layer 143B means that deposition of one titanium nitride layer 143A and one silicon nitride layer 143B is taken as a cycle, and a plurality of cycles are repeated to form the layer group (TSN) constituted by laminating the titanium nitride layer 143A and the silicon nitride layer 143B alternately. Resistance of silicon nitride is greater than that of the titanium and titanium nitride, and contact resistance of the contact structure 14 increases as a thickness of the silicon nitride increases. Therefore, a thickness of the silicon nitride layer 143B can be effectively reduced by laminating the titanium nitride layer 143A and the silicon nitride layer 143B alternately, which is conducive to reducing resistance of the layer group (TSN) and improving conductive performance of the contact structure 14.

In addition, in a process of manufacturing the second barrier layer 143, the titanium nitride layer 143A and the silicon nitride layer 143B may correspond to different cycle ratios in different formation cycles.

For example, the second barrier layer 143 is formed by using an advanced sequential flow deposition (ASFD) process.

In some embodiments, the first barrier layer 142 is a titanium layer. The second barrier layer 143 is the layer group formed by laminating the titanium nitride layer 143A and the silicon nitride layer 143B alternately. Resistance of the titanium layer is lower than that of the titanium nitride layer. Therefore, reducing a mass ratio of a raw material for forming the titanium nitride layer 143A to a raw material for forming the silicon nitride layer 143B in the second barrier layer 143 is conducive to reducing the resistance of the layer group (TSN) and ensuring electrical performance of the contact structure 14.

For example, the mass ratio of the raw material for forming the titanium nitride layer 143A to the raw material for forming the silicon nitride layer 143B in the second barrier layer 143 ranges from 10:1 to 20:1, for example, may be 10:1, 12:1, 15:1, 18:1, or 20:1. The titanium nitride layer 143A may be made of titanium chloride and ammonia, and the silicon nitride layer 143B may be made of silicon and ammonia, which is not limited herein.

In this embodiment of the present disclosure, the contact structure 14 includes the contact conductive layer 141, the first barrier layer 142, and the second barrier layer 143. The contact conductive layer 141 is the polycrystalline silicon layer, the first barrier layer 142 is the titanium layer, and the second barrier layer 143 is the layer group formed by laminating the titanium nitride layer and the silicon nitride layer alternately. In this way, the second barrier layer 143 can be used to effectively prevent diffusion of the impurity elements (such as boron (B) and phosphorus (P)) in the contact conductive layer 141 to the bit line structure, so as to avoid adverse impact of the impurity elements on electrical properties of the bit line structure. In addition, the first barrier layer 142 can also be used to effectively prevent diffusion of nitrogen ions in the second barrier layer 143 to the contact conductive layer 141, so as to avoid adverse impact of the nitrogen ions on electrical properties of the contact conductive layer 141. This can ensure good electrical performance of the contact structure 14 and the bit line structure.

In conclusion, the method of manufacturing a contact structure provided in this embodiment of the present disclosure can improve the electrical performance of the contact structure and the semiconductor structure in which the contact structure is located, so as to improve the yield of the semiconductor structure.

Some embodiments of the present disclosure further provide a contact structure, which is manufactured by using the manufacturing method in some of the foregoing embodiments.

As shown in FIG. 10, the contact structure 14 is formed in a contact hole H, the contact hole H is disposed in an active region of a substrate 10 and in a medium layer 12, and the medium layer 12 covers the substrate 10.

In an example, the substrate 10 includes but is not limited to a silicon substrate or a silicon-based substrate. The substrate 10 is provided with an STI structure 11, and the STI structure 11 separates a plurality of active regions in the substrate 10.

The STI structure 11 is, for example, a $SiO_2$ isolation structure.

In an example, the medium layer 12 covers the substrate 10 and the STI structure 11. The medium layer 12 and the STI structure 11 are made of different materials. For example, the medium layer 12 may be a silicon nitride layer.

In an example, with reference to FIG. 4 and FIG. 10, the contact hole H includes a first contact hole $H_1$ penetrating through the medium layer 12, and a second contact hole $H_2$ located at the bottom of the first contact hole $H_1$ and formed in the substrate 10.

For example, an aperture of a part that is of the second contact hole $H_2$ and close to the first contact hole $H_1$ gradually increases along a direction close to the first contact hole $H_1$, and a maximum aperture of the second contact hole $H_2$ is equal to or less than an aperture of the first contact hole $H_1$.

For example, the aperture of the part that is of the second contact hole $H_2$ and close to the first contact hole $H_1$ increases uniformly (for example, increases linearly) or increases according to a preset change rule (for example, increases curvilinearly) along the direction close to the first contact hole $H_1$.

For example, referring to FIG. 4 and FIG. 10, if the part that is of the second contact hole $H_2$ and close to the first contact hole $H_1$ and whose aperture gradually increases along the direction close to the first contact hole $H_1$ is taken as a first part, the second contact hole $H_2$ further includes a second part located on a side on which the first part of the second contact hole $H_2$ is away from the first contact hole $H_1$. An aperture of the second part may remain unchanged or gradually increase along a direction close to the first part. Moreover, in an example in which the aperture of the second part of the second contact hole $H_2$ gradually increases along the direction close to the first part of the second contact hole $H_2$, a change rate when the aperture of the second part increases along the direction close to the first part is less than a change rate when the aperture of the first part increases along the direction close to the first contact hole $H_1$.

Depths of the first contact hole Hi and the second contact hole $H_2$ may be set according to an actual requirement. Because the first contact hole $H_1$ penetrates through the medium layer 12, a thickness of the medium layer 12 is the depth of the first contact hole $H_1$.

Orthographic projection of any cross section of the contact hole H on the substrate 10 may be circular, elliptical, rectangular, or rhombic. This is not limited in this embodiment of the present disclosure. Accordingly, an aperture of the contact hole H is a size of the contact hole H on a cross section that is of the contact hole H and parallel to the substrate 10.

In addition, that a maximum aperture of the second contact hole $H_2$ is equal to an aperture of the first contact hole Hi means that an upper edge of the second contact hole $H_2$ coincides with a lower edge of the first contact hole $H_1$. That a maximum aperture of the second contact hole $H_2$ is less than an aperture of the first contact hole $H_1$ means that there is a gap between the upper edge of the second contact hole $H_2$ and the lower edge of the first contact hole $H_1$, and the upper edge of the second contact hole $H_2$ and the lower edge of the first contact hole $H_1$ can be connected by a plane parallel to the substrate 10.

In some embodiments, the aperture of the first contact hole $H_1$ may gradually increase or remain unchanged along a direction away from the second contact hole $H_2$.

The contact structure 14 is formed in the contact hole H. The contact structure 14 further includes is a part that is located on the medium layer 12 and extends along a first direction. The contact structure 14 is, for example, a bit line contact structure, but is not limited thereto. For example, the contact structure 14 may alternatively be a memory node contact structure.

In some embodiments, the contact structure 14 includes a contact conductive layer 141, a first barrier layer 142, and a second barrier layer 143 that are laminated along a direction away from the substrate 10.

For example, the contact conductive layer 141 is a polycrystalline silicon layer. A part of the polycrystalline silicon layer is filled in the contact hole H, and a part of the polycrystalline silicon layer covers a surface, away from the substrate 10, of the medium layer 12 and extends along the first direction.

For example, the first barrier layer 142 is a titanium layer. The first barrier layer 142 is configured to block diffusion of nitrogen ions.

In some embodiments, a thickness of the titanium layer may range from 5 nm to 10 nm. For example, the thickness of the titanium layer may be 5 nm, 6 nm, 8 nm, or 10 nm.

In some embodiments, the second barrier layer 143 is a layer group (TSN) formed by laminating a titanium nitride layer 143A and a silicon nitride layer 143B alternately. A thickness of any titanium nitride layer 143A or silicon nitride layer 143B may be set according to an actual requirement. Moreover, a lamination sequence of the titanium nitride layer 143A and the silicon nitride layer 143B may also be adjusted according to an actual requirement. The second barrier layer 143 can effectively prevent diffusion of impurity elements (such as boron (B) and phosphorus (P)) in the contact conductive layer 141 to a bit line structure, so as to avoid adverse impact of the impurity elements on electrical properties of the bit line structure.

Figure 12:
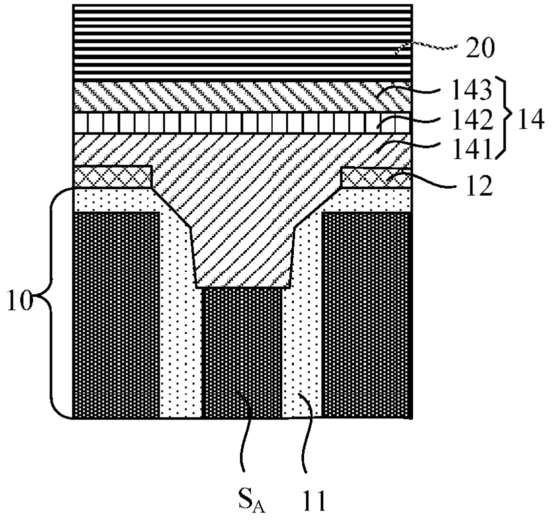
FIG. 12 is a schematic structural diagram of a semiconductor structure according to an embodiment.
Figure 13:
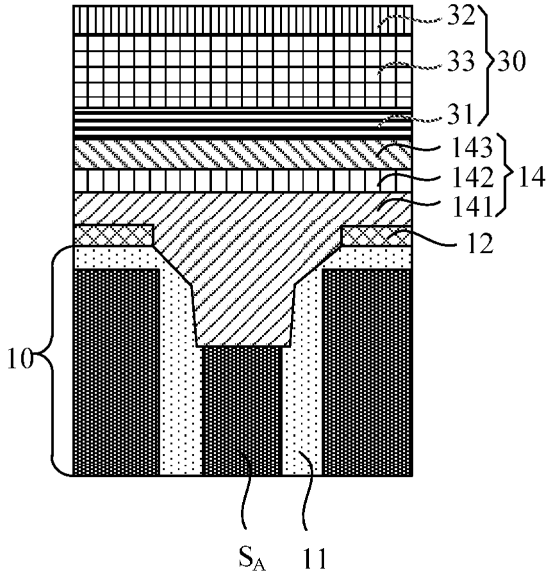
FIG. 13 is a schematic structural diagram of a semiconductor structure according to an embodiment.

Referring to FIG. 12 and FIG. 13, some embodiments of the present disclosure further provide a semiconductor structure, including the contact structure 14 described in some of the foregoing embodiments, and a bit line structure 20 or a memory capacitor 30 that is disposed on a surface that is of the contact structure 14 and away from a substrate 10.

For example, referring to FIG. 12, an active region of the substrate 10 includes a source region and a drain region. The contact structure 14 may be a bit line contact structure. The bit line structure 20 includes a bit line. In this way, the bit line in the bit line structure 20 can be connected to the source region of the active region through the corresponding bit line contact structure.

For example, referring to FIG. 13, the active region of the substrate 10 includes the source region and the drain region. The contact structure 14 may be a memory node contact structure. The memory capacitor 30 includes a first electrode 31 and a second is electrode 32 that are opposite to each other, and a dielectric layer 33 located between the first electrode 31 and the second electrode 32. The first electrode 31 is connected to the memory node contact structure. Herein, the memory capacitor 30 in FIG. 13 is only a schematic expression, and the memory capacitor 30 may be of another structure according to an actual requirement. In this way, the first electrode 31 of the memory capacitor 30 can be connected to the drain region of the active region $S_A$ through the corresponding memory node contact structure.

It should be noted that the active region of the substrate 10 may be distributed in an array. Moreover, a plurality of bit line structures 20 are parallel spaced, and each of the plurality of bit line structures 20 extends along a column direction. Based on this, contact structures 14 corresponding to source regions of each column of active regions $S_A$ can be connected to bit lines of one bit line structure 20, and contact structures 14 corresponding to drain regions of each column of active regions $S_A$ can be connected to one memory capacitor 30.

In the contact structure 14 and the semiconductor structure provided in the embodiments of the present disclosure, a shape of the contact hole H is improved. Specifically, the contact hole H is constituted by the first contact hole $H_1$ in the medium layer 12 and the second contact hole $H_2$ in the substrate 10 that communicate with each other. Moreover, a partial aperture of the second contact hole $H_2$ increases along the direction close to the first contact hole $H_1$, and the maximum aperture of the second contact hole $H_2$ is equal to or less than the aperture of the first contact hole $H_1$. In this way, when a bottom size of the contact hole H is small, it can be ensured that the contact hole H still has a large opening size, which is conducive to reducing a high aspect ratio of the contact hole H and improving step coverage of the contact structure 14. This can avoid unnecessary pores in the contact structure 14 (especially the polycrystalline silicon layer), which can further avoid abnormal electrical properties of the semiconductor structure due to metal penetration and filling of the pores in the contact structure 14.

In addition, in the embodiments of the present disclosure, the contact conductive layer 141 of the contact structure 14 is the polycrystalline silicon layer, the first barrier layer 142 is the titanium layer, and the second barrier layer 143 is the layer group formed by laminating the titanium nitride layer and the silicon nitride layer alternately. In this way, is the second barrier layer 143 can be used to effectively prevent diffusion of impurity elements (such as boron (B) and phosphorus (P)) in the contact conductive layer 141 to a conductive structure connected to the contact structure 14, so as to avoid adverse impact of the impurity elements on electrical properties of the conductive structure. In addition, the first barrier layer 142 can also be used to effectively prevent diffusion of nitrogen ions in the second barrier layer 143 to the contact conductive layer 141, so as to avoid adverse impact of the nitrogen ions on electrical properties of the contact conductive layer 141. This can ensure good electrical performance of the contact structure 14 and the conductive structure connected to the contact structure 14.

In conclusion, the contact structure 14 and the semiconductor structure provided in the embodiments of the present disclosure can improve the electrical performance of the contact structure 14 and the semiconductor structure, so as to improve a yield of the semiconductor structure.

The technical features of the above embodiments can be employed in arbitrary combinations. To provide a concise description, all possible combinations of all technical features of the above embodiments may not be described; however, these combinations of technical features should be construed as disclosed in this specification as long as no contradiction occurs.

The above embodiments are only intended to illustrate several implementations of the present disclosure in detail, and they should not be construed as a limitation to the patentable scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A method of manufacturing a contact structure, comprising:

providing a substrate, wherein the substrate is provided with a shallow trench isolation structure, and the shallow trench isolation structure separates an active region in the substrate;

forming a medium layer covering the substrate and the shallow trench isolation structure; and forming a contact hole in the active region of the substrate and in the medium layer, wherein the contact hole comprises a first contact hole penetrating through the medium layer, and a second contact hole located at a bottom of the first contact hole and formed in the substrate;

wherein forming the contact hole in the active region of the substrate and in the medium layer comprises:

forming a contact bottom hole in the active region of the substrate and in the medium layer, wherein a sidewall of the contact bottom hole is constituted by the shallow trench isolation structure and the medium layer; and removing a part of the medium layer of the sidewall of the contact bottom hole to form the first contact hole in the medium layer and a guide hole in the substrate, wherein the guide hole is arranged at the bottom of the first contact hole;

filling a hard mask material in the guide hole; and removing the hard mask material by a preset thickness, such that the hard mask material retained in the guide hole forms the hard mask and a part of the shallow trench isolation structure is exposed above the hard mask;

removing the part of the shallow trench isolation structure exposed above the hard mask after the hard mask is formed; and removing the hard mask to form the second contact hole.

2. The method of manufacturing a contact structure according to claim 1, wherein an aperture of a part that is of the second contact hole and close to the first contact hole gradually increases along a direction close to the first contact hole, and a maximum aperture of the second contact hole is equal to or less than an aperture of the first contact hole.

3. The method of manufacturing a contact structure according to claim 1, wherein removing the part of the medium layer of the sidewall of the contact bottom hole to form the first contact hole in the medium layer and the guide hole in the substrate comprises:

cleaning a structure obtained after the contact bottom hole is formed, to etch back and remove the part of the medium layer of the sidewall of the contact bottom hole.

4. The method of manufacturing a contact structure according to claim 1, further comprising:

forming a contact structure extending along a first direction in the contact hole and on the medium layer.

5. The method of manufacturing a contact structure according to claim 4, wherein the forming a contact structure extending along a first direction in the contact hole and on the medium layer comprises:

forming a contact conductive layer extending along the first direction in the contact hole and on the medium layer;

forming a first barrier layer covering the contact conductive layer; and forming a second barrier layer covering the first barrier layer; wherein the contact conductive layer, the first barrier layer, and the second barrier layer constitute the contact structure.

6. The method of manufacturing a contact structure according to claim 5, wherein a material of the first barrier layer comprises titanium.

7. The method of manufacturing a contact structure according to claim 5, wherein a thickness of the first barrier layer ranges from 5 nm to 10 nm.

8. The method of manufacturing a contact structure according to claim 5, wherein the second barrier layer comprises a layer group formed by laminating a titanium nitride layer and a silicon nitride layer alternately; and the forming a second barrier layer covering the first barrier layer comprises: depositing the titanium nitride layer and the silicon nitride layer on the first barrier layer periodically.

9. The method of manufacturing a contact structure according to claim 8, wherein a mass ratio of a raw material for forming the titanium nitride layer to a raw material for forming the silicon nitride layer in the second barrier layer ranges from 10:1 to 20:1.

* * * * *